United States Patent
Abadeer et al.

(10) Patent No.: US 7,814,449 B2
(45) Date of Patent: *Oct. 12, 2010

(54) DESIGN STRUCTURE FOR MULTIPLE SOURCE-SINGLE DRAIN FIELD EFFECT SEMICONDUCTOR DEVICE AND CIRCUIT

(75) Inventors: Wagdi W. Abadeer, Jericho, VT (US); Anthony R. Bonaccio, Shelburne, VT (US); Joseph A. Iadanza, Hinesburg, VT (US)

(73) Assignee: International Business Machines Corporation, Armonk, NY (US)

(*) Notice: Subject to any disclaimer, the term of this patent is extended or adjusted under 35 U.S.C. 154(b) by 436 days.

This patent is subject to a terminal disclaimer.

(21) Appl. No.: 11/873,515

(22) Filed: Oct. 17, 2007

(65) Prior Publication Data

US 2009/0106707 A1   Apr. 23, 2009

(51) Int. Cl.
G06F 17/50 (2006.01)
G06F 9/45 (2006.01)

(52) U.S. Cl. .................. 716/6; 716/1; 716/2; 716/3; 716/5

(58) Field of Classification Search .............. 716/1–3, 716/5–6
See application file for complete search history.

(56) References Cited

U.S. PATENT DOCUMENTS

| | | |
|---|---|---|
| 3,731,122 A | 5/1973 | Rosenbaum et al. |
| 3,898,479 A | 8/1975 | Proebsting |
| 4,500,800 A | 2/1985 | Cases et al. |
| 4,596,959 A | 6/1986 | Kawakami |
| 4,629,993 A | 12/1986 | Bouvier et al. |
| 4,638,190 A | 1/1987 | Hwang et al. |
| 4,691,302 A | 9/1987 | Mattausch |
| 4,994,773 A | 2/1991 | Chen et al. |
| 5,012,143 A | 4/1991 | Boudewijns |
| 5,111,085 A | 5/1992 | Stewart |
| 5,121,014 A | 6/1992 | Huang |
| 5,144,174 A | 9/1992 | Murakami |
| 5,146,306 A | 9/1992 | Ferry et al. |
| 5,218,237 A | 6/1993 | Mao |

(Continued)

OTHER PUBLICATIONS

Baker, et al., "A Waffle Layout Technique Strengthens the ESD Hardness of the NMOS Output Transistor," 1989 EOS/ESD Symposium Proceedings, pp. 175-181.

(Continued)

*Primary Examiner*—Nghia M Doan
(74) *Attorney, Agent, or Firm*—Gibb I.P. Law Firm, LLC (57) ABSTRACT

Disclosed are embodiments of a design structure for a variable-delay field effect transistor (FET) having multiple source regions that can be individually and selectively biased to provide an electrical connection to a single drain region. Delay is a function of which of the multiple source regions is/are selectively biased as well as a function of gate resistance and capacitance. Such a variable-delay FET can be incorporated into a phase adjusting circuit, which uses gate propagation delays to selectively phase adjust an input signal. The phase adjusting circuit can be tuned by incorporating non-salicided resistances and additional capacitance at various positions on the gate structure. The phase adjusting circuit can further be modified into a phase adjusting mixer circuit that enables a phase adjusted signal to be combined with an additional signal.

20 Claims, 7 Drawing Sheets

U.S. PATENT DOCUMENTS

| | | | |
|---|---|---|---|
| 5,227,679 A | 7/1993 | Woo | |
| 5,334,891 A * | 8/1994 | Marbot | 327/281 |
| 5,400,370 A | 3/1995 | Guo | |
| 5,451,894 A | 9/1995 | Guo | |
| 5,548,237 A | 8/1996 | Iadanza et al. | |
| 5,550,728 A | 8/1996 | Ellis | |
| 5,637,900 A | 6/1997 | Ker et al. | |
| 5,663,670 A | 9/1997 | Iadanza et al. | |
| 5,714,784 A | 2/1998 | Ker et al. | |
| 5,717,622 A | 2/1998 | Kawamoto et al. | |
| 5,754,380 A | 5/1998 | Ker et al. | |
| 5,764,093 A | 6/1998 | Hayashi et al. | |
| 5,770,960 A | 6/1998 | Iadanza et al. | |
| 5,815,009 A | 9/1998 | Iadanza et al. | |
| 5,852,315 A | 12/1998 | Ker et al. | |
| 5,877,713 A | 3/1999 | Marie | |
| 5,894,239 A | 4/1999 | Bonaccio et al. | |
| 5,920,203 A | 7/1999 | Bailey et al. | |
| 6,087,875 A | 7/2000 | Defaxio | |
| 6,169,438 B1 | 1/2001 | Wu et al. | |
| 6,259,294 B1 | 7/2001 | Murakami et al. | |
| 6,304,124 B1 * | 10/2001 | Mizuno | 327/281 |
| 6,320,480 B1 | 11/2001 | Kintis et al. | |
| 6,429,710 B1 | 8/2002 | Ting et al. | |
| 6,593,789 B2 | 7/2003 | Atallah et al. | |
| 6,680,636 B1 | 1/2004 | Perry et al. | |
| 6,747,504 B2 | 6/2004 | Simpson et al. | |
| 6,859,082 B2 | 2/2005 | Tang | |
| 6,867,716 B2 | 3/2005 | Zhang | |
| 7,030,426 B2 | 4/2006 | Neidig | |
| 7,034,577 B2 | 4/2006 | Kawasumi | |
| 7,036,098 B2 * | 4/2006 | Eleyan et al. | 716/4 |
| 7,124,385 B2 * | 10/2006 | McGuinness et al. | 716/9 |
| 7,161,394 B2 | 1/2007 | Lee | |
| 7,180,352 B2 | 2/2007 | Mooney et al. | |
| 7,212,055 B2 | 5/2007 | Yoo et al. | |
| 7,403,055 B2 | 7/2008 | Minzoni | |
| 7,456,665 B2 | 11/2008 | Hinz et al. | |
| 7,498,859 B2 | 3/2009 | Kim | |
| 7,525,077 B2 * | 4/2009 | Kim et al. | 250/208.1 |
| 2002/0079925 A1 | 6/2002 | Dietrich et al. | |
| 2002/0140484 A1 | 10/2002 | Komura et al. | |
| 2003/0001650 A1 | 1/2003 | Cao et al. | |
| 2004/0075481 A1 | 4/2004 | Reuveni et al. | |
| 2004/0090254 A1 | 5/2004 | Owens et al. | |
| 2007/0103215 A1 | 5/2007 | Boerstler et al. | |
| 2007/0115035 A1 | 5/2007 | Hinz et al. | |
| 2007/0247203 A1 | 10/2007 | Cho et al. | |
| 2007/0247205 A1 | 10/2007 | Kim | |

OTHER PUBLICATIONS

Hastings, A., "The Art of Analog Layout," Prentice Hall, Chapter 12, pp. 416-417, 2001.

* cited by examiner

DESIGN STRUCTURE FOR MULTIPLE SOURCE-SINGLE DRAIN FIELD EFFECT SEMICONDUCTOR DEVICE AND CIRCUIT

CROSS-REFERENCE TO RELATED APPLICATIONS

This application is related to U.S. application Ser. No. 11/833,538 filed Aug. 3, 2007, the complete disclosure of which, in its entirety, is herein incorporated by reference.

This application is also related to the following co-pending application Ser. No. 11/833,567 filed concurrently herewith by the same Applicants and assigned to the same Assignee, namely, International Business Machines Corporation (IBM Corporation): "Micro-Phase Adjusting And Micro-Phase Adjusting Mixer Circuits Designed With Standard Field Effect Transistor Structures". The complete disclosure of this co-pending application is incorporated herein by reference.

BACKGROUND

1. Field of the Invention

The embodiments of the invention generally relate to phase adjusting and mixing circuits and, more particularly, to a novel multiple source-single drain semiconductor device that can be incorporated into a phase adjusting circuit and/or a mixing circuit.

2. Description of the Related Art

With recent advances in semiconductor technology, integration levels have increased to the point where the functional capabilities of a single system-on-a-chip (SOC) produced today may exceed those of an entire computer that was produced less than five years ago. For example, complex analog functions (e.g., high speed serial interfaces) are routinely integrated into such SOCs. Operation of such high speed serial interfaces commonly requires a means of phase synchronization to correctly sample incoming data. Such phase synchronization can be accomplished using a phase rotator designed to mix several phase-related signals in order to create a selectable phase offset. However, while adequate for current clock speeds and de-serialization usage, phase rotators are typically large, expensive, complex and have limited frequency/granularity. Additionally, technological advancements have recently been made allowing for embedded radio frequency (RF) functions within larger digital integrated circuits. Typical RF functions commonly require demodulator circuits for effective sampling of high frequency transmissions with a lower speed functional clock. As with phase rotators, these demodulator circuits may be large and complex. Therefore, there is a need in the art for a circuit topology which provides for low cost input signal phase-adjustment capability in order to fine tune input signal arrival and data synchronization in digital systems.

SUMMARY

In view of the foregoing, disclosed herein are embodiments of a novel variable-delay field effect transistor (FET) with multiple source regions that can be individually and selectively biased to provide an electrical connection to a single drain region. Delay is a function of which of the multiple source regions is/are selectively biased as well as a function of gate resistance and capacitance. Such a variable-delay FET can be incorporated into a phase adjusting circuit. Specifically, such a variable-delay FET can enable a simple space-saving phase adjusting circuit, in which small increments of selectable phase adjustments can be made to a periodic input signal as a function of propagation delay. The phase adjusting circuit can be tuned by incorporating non-silicided resistances in the gate structure and/or additional gate capacitance at various positions. The phase adjusting circuit can further be modified into a phase adjusting mixer circuit that enables a phase adjusted signal to be combined with an additional signal.

An embodiment of the variable-delay FET can comprise a semiconductor substrate with a single output diffusion region (i.e., a drain region), a plurality of input diffusion regions (i.e., source regions), and a channel region between the output diffusion region and each input diffusion region as well as between adjacent input diffusion regions. The input diffusion regions are adapted to be selectively biased in order to selectively vary delay.

The variable-delay FET can further comprise a gate structure above the channel region. The gate structure can comprise a solid gate dielectric layer-gate polysilicon stack with a main body and a plurality of extensions from that main body. The main body can comprise a plurality of gate segments, where each gate segment is positioned between the output diffusion region and a corresponding one of the input diffusion regions. Each extension can project outward from the main body such that separate extensions project out from each end of the main body as well as from the gate segment interfaces between adjacent input diffusion regions. Thus, the gate structure extensions can provide off-mode separation between each of the input diffusion regions.

The top surface of the gate structure can be completely silicided. Alternatively, silicide regions can be formed on only selected portions of the gate in order to tailor resistance and, thereby, propagation delay. For example, the top surface of the gate structure at the gate segment interfaces may be devoid of silicide so as to delay signal propagation between gate segments.

Alternative configurations of the variable-delay FET can be implemented. For example, in one configuration the main body of the gate structure can be non-linear (i.e., polygonal, curved, etc.) and the input diffusion regions as well as the gate structure can be at least partially wrapped around the output diffusion region. In another configuration, the main body of the gate structure can be linear and the input diffusion regions and the gate structure can be adjacent to only one side of the output diffusion region. In each of these configurations, the output diffusion region can be larger than any individual input diffusion region. Additionally, in each of these configurations, the gate segment lengths adjacent to each corresponding input diffusion region can be the same so that delay is varied in uniform increments. Alternatively, the gate segment lengths adjacent to each corresponding input diffusion region can be different such that delay is varied in non-uniform increments.

An embodiment of a phase adjusting circuit can comprise a variable-delay field effect transistor, as described above, connected between an input node and an output node. Specifically, the input node can be adapted to receive a periodic signal requiring phase adjustment (i.e., a first signal) from another device (e.g., from another logic circuit, a clock driver, etc.) that is logically positioned before the phase adjusting circuit. The input node can be connected to the gate of the variable-delay FET at one end so that when the first signal is driven into the input node, it is received by the gate. The output node can be connected to the output diffusion region of the variable-delay FET and can provide the inverting output of the phase adjusting circuit. A current source (i.e., the load device) can be connected between the output node and a reference voltage. This current source can be adapted to bias the output node when the variable-delay FET is off. Additionally, switches (e.g., selection FETs controlled by select lines) can be used to selectively connect each of the input diffusion regions to a voltage rail (e.g., ground) so as to allow selective individual biasing of one or more of the input diffusion regions.

Given the gate structure of the variable-delay FET, when the first signal is driven into the input node, this signal is received by the gate and propagated sequentially through each adjacent gate segment in the main body of the gate as well as through each extension. Furthermore, when an active edge of this first signal reaches the first gate segment in the main body, a channel (i.e., an electrical connection) is enabled between the first input diffusion region (i.e., the input diffusion region adjacent the first gate segment) and the output diffusion region. Next, when the active signal reaches the second gate segment in the main body, a channel is enabled between the second input diffusion region (i.e., the input diffusion region adjacent the second gate segment) and the output diffusion region. This continues until finally the active edge of the first signal reaches the last gate segment, enabling a channel between the last input diffusion region and the output diffusion region. Although the active edge of the input signal will enable these channels in sequence, for each unselected switch, impedance will remain high in the corresponding input diffusion region, thereby, preventing impact on the circuit output. That is, although channels are enabled, a second signal (i.e., a phase adjusted signal) is not passed between any of the input diffusion regions and the output diffusion region until an input diffusion region is selectively biased. Consequently, phase adjustment of the first signal is a function of propagation delay of the first signal through the gate structure and a function of which one or more of the input diffusion regions are selectively biased.

More specifically, during operation of the phase adjusting circuit, a single input diffusion region can be selectively biased. When this single input diffusion region is selectively biased, impedance will go low in that input diffusion region but will remain high in all of the other input diffusion regions. Then, when the first signal is propagated sequentially through the gate structure and the active edge of the first signal passes through the gate segment that is positioned adjacent to the biased input diffusion region, a channel (i.e., an electrical connection) will be enabled between that biased input diffusion region and the output diffusion region. Biasing of the selected input diffusion region, allows a second signal (i.e., a phase adjusted signal) to begin passing from the selectively biased input diffusion region to the output diffusion region once the channel is enabled. The second signal is combined at the output node with the load of the current source. Additionally, when the inactive edge of the first signal passes through that same gate segment, the electrical connection will be broken.

The phase difference between the first and second signals is based in part on which input diffusion region is selected relative to the originating point of the first signal. That is, the greater the distance between the selected input diffusion region and the originating point of the first signal in the gate structure, the greater the propagation delay and, thus, the greater the phase adjustment. The closer the distance between the selected input diffusion region and the originating point of the input signal in the gate structure, the smaller the propagation delay and, thus, the smaller the phase adjustment.

Alternatively, during operation of the phase adjusting circuit, multiple input diffusion regions can be selectively and simultaneously biased. When multiple input diffusion regions are selectively biased, impedance will remain high in all of the other input diffusion regions. When the first signal is driven into the input node and received by the gate structure at one end, channels will be enabled between the input diffusion regions and the output diffusion region in sequence. However, as the active edge of the first signal reaches the gate segment that is positioned adjacent to the first biased input diffusion region, a second signal (i.e., a phase adjusted signal) will begin passing from the first selectively biased input diffusion region to the output diffusion region. When the active edge of the first signal passes through the gate segment adjacent to the second selected input diffusion region, nothing happens because the output diffusion region is already biased to the second signal (e.g., pulled-down). Similarly, when the inactive edge of the first signal passes through the gate segment adjacent to the first selected input diffusion region, nothing happens because the output diffusion region continues to be biased to the second signal (e.g., pulled-down), due to biasing of the second selected input diffusion region. Only when the inactive edge of the first signal passes through the gate segment that corresponds to the last selected input diffusion region is the electrical connection broken, thereby, allowing the output diffusion region to again be pulled by the current source. Thus, not only is the phase of the first signal adjusted, but also the pulse width.

Delay and, thus, phase-adjustment are based, not only on which diffusion region(s) is/are biased, but also on gate resistance and capacitance (i.e., gate RC delay). Gate resistance and capacitance can be finely tuned during design in order to achieve the desired phase offset increments. For example, the top surface of the gate structure can be completely salicided to minimize and make uniform resistance across the gate structure. Alternatively, the silicide regions can be positioned on only selected portions of the top surface of the gate structure in order to vary gate resistance and, thereby, to tailor propagation delay. For example, the top surface of the gate structure at the gate segment interfaces may be devoid of silicide so as to delay signal propagation between each of the adjacent gate segments. Additionally, one or more capacitors can be electrically connected to the gate structure at one or more of the gate extensions in order to selectively increase gate capacitance and, thereby, to tailor propagation delay.

As described above, an embodiment of a phase adjusting circuit can comprise a current source that is constant. Alternatively, another embodiment of a phase adjusting circuit can comprise a current source that is non-constant and further that is dependent upon the first signal at the input node. For example, the current source of the phase adjusting circuit can comprise an additional delay device (e.g., a non-variable delay FET, a second variable-delay FET or any other suitable delay device) that is also connected between the input and output nodes of the phase adjusting circuit. In this embodiment the variable-delay FET and the additional delay device can both be adapted to receive the first signal and simultaneously, but independently, phase adjust the first signal. The output node can be adapted to combine the separate phase adjusted signals from the different delay devices such that the final output of the phase adjusting circuit is a single combined phase adjusted signal.

Yet another embodiment of a phase adjusting circuit can comprise a phase adjusting mixer circuit. Specifically, this embodiment can comprise a current source that is both non-constant and not dependent upon the first signal at the input node. Thus, this circuit functions as both a phase adjusting circuit and a mixer circuit. That is, in a phase adjusting mixer circuit embodiment, the current source can be electrically connected to the output node, but not the input node. This current source can be adapted to transmit a third signal (i.e., a different input signal) to the output node. The second signal from the variable-delay FET and third signal from the current source can combined at the output node such that the final output of the phase adjusting mixer circuit comprises a fourth signal.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, with recent advances in semiconductor technology, integration levels have increased to the point where the functional capabilities of a single system-on-a-chip (SOC) produced today may exceed those of an entire computer that was produced less than five years ago. For example, complex analog functions (e.g., high speed serial interfaces) are routinely integrated into such SOCs. Operation of such high speed serial interfaces commonly requires a means of phase synchronization to correctly sample incoming data. Such phase synchronization can be accomplished using a phase rotator designed to mix several phase-related signals in order to create a selectable phase offset. However, while adequate for current clock speeds and de-serialization usage, phase rotators are typically large, expensive, complex and have limited frequency/granularity. Additionally, technological advancements have recently been made allowing for embedded radio frequency (RF) functions within larger digital integrated circuits. Typical RF functions commonly require demodulator circuits for effective sampling of high frequency transmissions with a lower speed functional clock. As with phase rotators, these demodulator circuits may be large and complex. Therefore, there is a need in the art for a circuit topology which provides for low cost input signal phase-adjustment capability in order to fine tune input signal arrival and data synchronization in digital systems.

In view of the foregoing, disclosed herein are embodiments of a variable-delay field effect transistor (FET) with a novel "waffle" structure. That is, the variable-delay FET has multiple source regions that can be individually and selectively biased to provide an electrical connection to a single drain region. Delay is a function of which of the multiple source regions is/are selectively biased as well as a function of gate resistance and capacitance. Such a variable-delay FET can be incorporated into a phase adjusting circuit, which uses gate propagation delays to selectively delay an input to output transfer. Specifically, the variable-delay FET of the present invention enables a simple space-saving phase adjusting circuit, in which small increments of selectable phase adjustments can be made to a periodic input signal as a function of propagation delay. The variable-delay FET within the phase adjusting circuit can be tuned during design by incorporating non-silicided resistances in the gate structure and additional capacitance at various positions about the gate structure. The phase adjusting circuit can further be modified into a phase adjusting mixer circuit, which uses independent time-varying biases on pull-up and pull-down portions of the variable-delay FET to implement a mixer. Specifically, this phase adjusting mixer circuit enables a phase adjusted signal to be combined with an additional signal. These phase adjusting and phase adjusting mixer circuits can be used in future delay lines and transceiver circuits.

Figure 1:
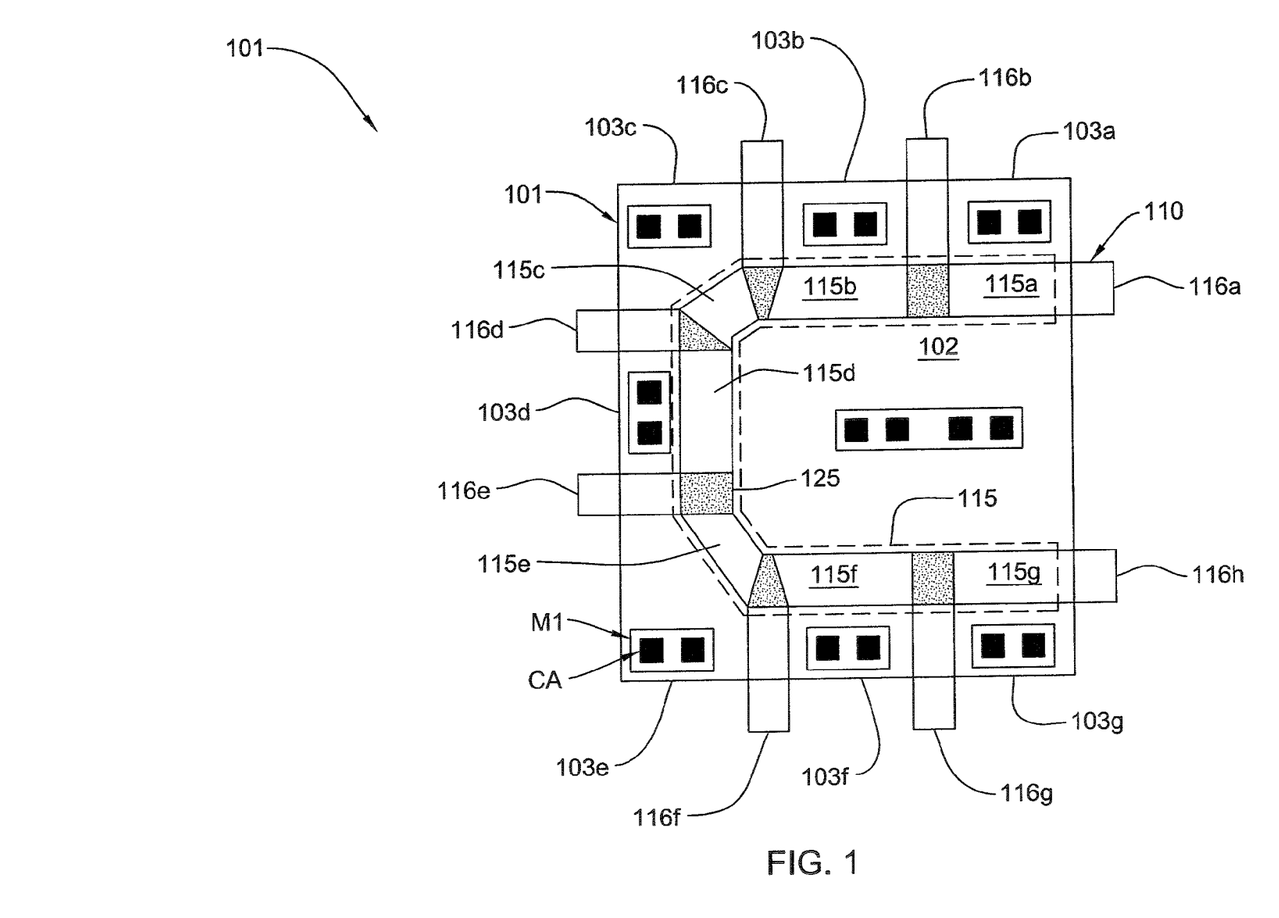
FIG. 1 is a diagram illustrating an exemplary physical structure of a variable-delay field effect transistor.

Referring to FIG. 1, an embodiment of the variable-delay FET 101 can comprise a semiconductor substrate with an output diffusion region 102 (i.e., a drain region), a plurality of input diffusion regions 103*a-g* (i.e., source regions), and a channel region between the output diffusion region 102 and each input diffusion region 103*a-g* as well as between adjacent input diffusion regions (e.g., between 103*a* and 103*b*, between 103*b* and 103*c*, etc.). The input diffusion regions 103*a-g* are individually selectable (i.e., individually biasable). That is, each input diffusion region 103*a-g* is adapted to be selectively biased in order to selectively vary delay of the transistor 101.

The output diffusion region 102 and input diffusion regions 103*a-g* can be doped with a first type dopant and the channel region can be doped with a second opposite type dopant. For example, for an n-type variable-delay FET 101, the diffusion regions 102 and 103*a-g* can be doped with an n-type dopant, such as phosphorus (P), antimony (Sb) or arsenic and the channel region can be doped with a p-type dopant, such as boron (B) and vice versa for a p-type variable-delay FET. The width of the channel region (i.e., the spacing between each adjacent input diffusion region and between the input diffusion regions and the output diffusion region) can be application-specific.

The variable-delay FET 101 can further comprise a gate structure 110 above the channel region. The gate structure 110 can comprise a solid gate dielectric layer-gate polysilicon layer stack with a main body 115 and a plurality of extensions 116a-h from that main body. The gate polysilicon layer can be sufficiently doped (e.g., with an appropriate n-type or p-type dopant) so that a signal driven into the gate structure can be conducted through the gate structure. The main body 115 can comprise a plurality of gate segments 115a-g, where each gate segment is positioned between the output diffusion region 102 and a corresponding one of the input diffusion regions 103a-g. Each extension 116a-h can project outward from the main body 115 such that separate extensions project out from each end of the main body (see extensions 116a and 116h) as well as from adjacent gate segment interfaces between adjacent input diffusion regions (e.g., extension 116b at interface between gate segments 115a and 115b between input diffusion regions 103a and 103b, etc.). Thus, the gate structure extensions 116a-h can provide off-mode separation between each of the input diffusion regions 103a-g.

The top surface of the gate structure 110 can be completely salicided (i.e., can be completely covered in a metal silicide layer (e.g., cobalt, platinum or nickel silicide or other materials). Alternatively, silicide regions can be formed on only selected portions of the gate structure 110 in order to tailor resistance across the gate structure and, thereby, add to resistance-capacitance (RC) propagation delay. For example, the top surface of the gate structure 110 at the gate segment interfaces may be devoid of silicide so as to increase gate resistance at the interfaces and thereby to delay signal propagation between gate segments (see non-silicide regions 125).

Alternative configurations of the variable-delay FET 101 can be implemented. For example, in one configuration (as illustrated in FIG. 1) the main body of the gate structure 110 can be non-linear (e.g., polygonal, curved, rolled, etc.) and the input diffusion regions 103a-g as well as the gate structure 110 can be positioned so that they at least partially wrap around the output diffusion region 102. In another configuration, the main body 115 of the gate structure 110 can be linear and the input diffusion regions 103a-g and the gate structure 110 can be positioned adjacent to only one side of the output diffusion region 102. In each of these configurations, the output diffusion region 102 can be larger than any individual input diffusion region 103a-g. Additionally, in each of these configurations, the lengths of the gate segments 115a-g (i.e., the length of each segment adjacent to each corresponding input diffusion region 103a-g) can be the same so that delay can be varied in uniform increments. Alternatively, the lengths of the gate segments 115a-g adjacent to each corresponding input diffusion region 103a-g can be different such that delay is varied in non-uniform increments.

The above-described variable-delay FET 101 can be formed using conventional FET processing techniques. For example, a semiconductor substrate, such as a bulk silicon wafer or a silicon-on-insulator (SOI), wafer can be provided. Shallow trench isolation structures can be formed in the substrate so as to delineate the boundaries of the FET 101. A gate stack, including a gate dielectric layer, gate polysilicon layer, and cap layer, can be formed on the substrate. The gate stack can then be lithographically patterned and etched so as to form the above-described solid gate structure 110 over the designated channel region between the output diffusion region 102 and the various input diffusion regions 103a-g as well as between adjacent input diffusion regions. Following gate structure 110 formation, additional processing steps can be performed in order to complete the FET 101 structure. These processing steps can include, but are not limited to, extension and halo implantation, sidewall spacer formation, deep source/drain implantation, silicide formation, dielectric layer deposition, contact formation, etc.

Figure 2:
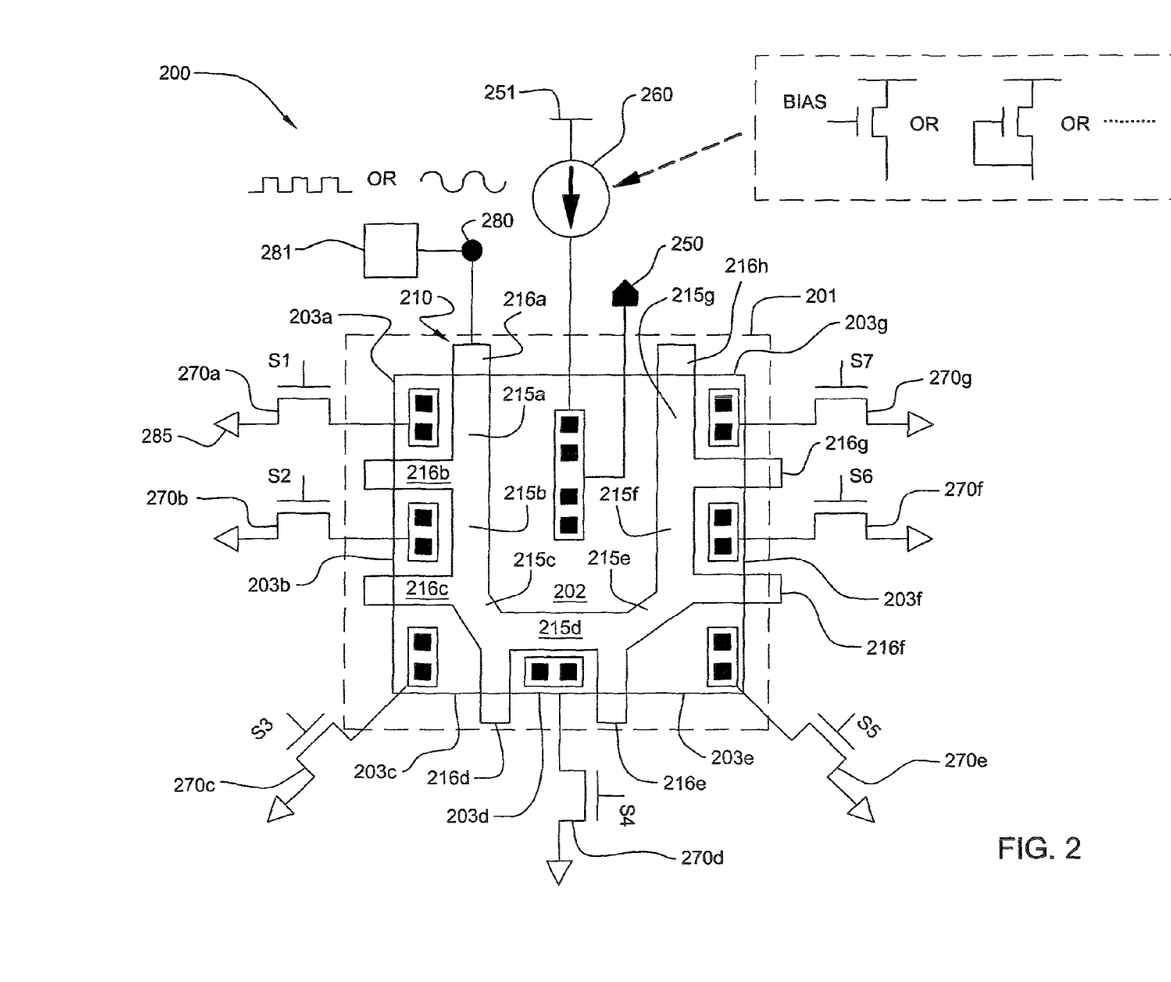
FIG. 2 is a schematic diagram illustrating an exemplary phase adjusting circuit incorporating the variable-delay field effect transistor of FIG. 1.

Referring to FIG. 2 in combination with FIG. 1, an embodiment of a phase adjusting circuit 200 can comprise a variable-delay field effect transistor 201, as described above, connected between an input node 280 and an output node 250. Specifically, the input node 280 can be adapted to receive a periodic signal requiring phase adjustment (i.e., a first signal) from another device 281 (e.g., from another logic circuit, a clock driver, etc.) that is logically positioned before the phase adjusting circuit 200. The input node 280 can be connected to the gate 210 of the variable-delay FET 201 at one end (see first gate extension 216a) so that when the first signal is driven into the input node 280, it is received by the gate 210. The output node 250 can be connected to the output diffusion region 202 of the variable-delay FET 201 and can provide the inverting output of the phase adjusting circuit 200. A current source 260 (i.e., the load device) can be connected between the output node 250 and a voltage rail 251 (i.e., a reference voltage). This current source 260 can be adapted to bias the output node when the variable-delay FET is off. Additionally, switches 270a-g (e.g., digital selection switches or selection FETs) can be connected to each of the input diffusion regions 203a-g and can be controlled via select lines S1-S7, respectively, so as to allow selective individual biasing of one or more of the input diffusion regions.

Given the gate structure 210 of the variable-delay FET 201, when the first signal (i.e., a periodic signal from another device 281 requiring phase adjustment) is driven into the input node 280, this signal is received by the gate 210 at one end (see extension 216a) and is propagated sequentially through each adjacent gate segment 215a-g in the main body 215 of the gate 210 as well as through each extension 216b-h. Furthermore, when an active edge of this first signal reaches the first gate segment 215a in the main body, a channel (i.e., an electrical connection) between the input diffusion region adjacent to the first gate segment 215a (i.e., the first input diffusion region 203a) and the output diffusion region 202 will be enabled. Next, when the active edge of the first signal reaches the second gate segment 215b, a channel will be enabled between the input diffusion region adjacent to the second gate segment 215b (i.e., the second input diffusion region 203b) and the output diffusion region 202, and so on until finally the active edge reaches the last gate segment 215g, enabling a channel between the last input diffusion region 203g and the output diffusion region 202. Although the active edge of the input signal will enable these channels in sequence, for each unselected switch 270a-g, impedance will remain high in the corresponding input diffusion region 203a-g, thereby, preventing impact on the circuit output at node 250. That is, although channels are enabled, a second signal (i.e., a phase adjusted signal) is not transmitted between any of the input diffusion regions 203a-g and the output diffusion region 202 until an input diffusion region is selectively biased. Finally, as the inactive edge of the first signal passes through the gate segments, the corresponding channels between the input diffusion regions 203a-g and the output diffusion region 202 are disabled (i.e., the electrical connections are broken).

For the purposes of this disclosure, an active edge of the first signal refers to a point in the periodic signal wave when a value of the signal is such that it turns-on or inverts the FET

201. Contrarily, an inactive edge is a point in the periodic signal wave when a value of the signal is such that it turns-off the FET 201.

Figure 3:
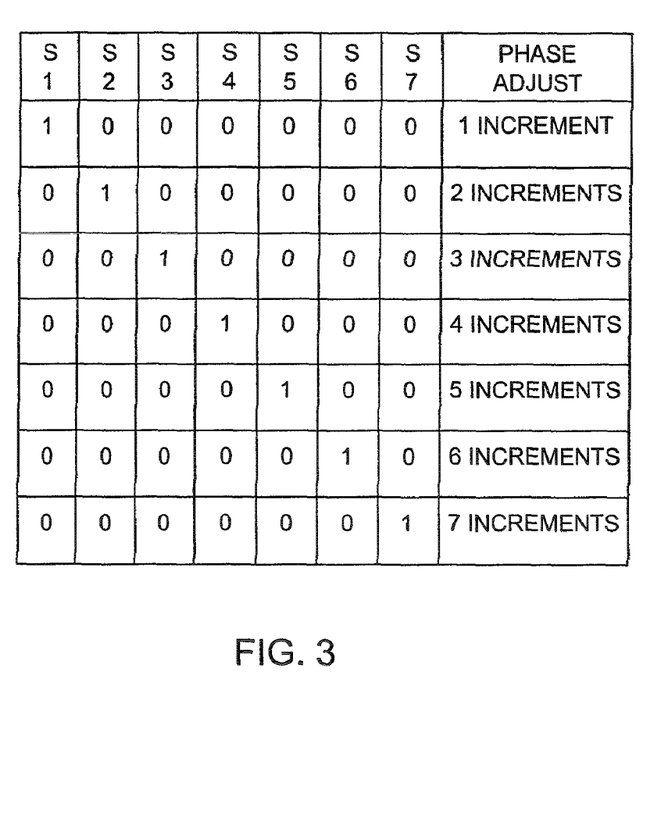
FIG. 3 is a table illustrating selective behavior in the phase adjusting circuit of FIG. 2.

More specifically, during operation of the phase-adjusting circuit 200 of FIG. 2, a single input diffusion region (e.g., 203*c*) can be selectively biased (i.e., switched on using a switch (e.g., 270*c*) so that impedance will be biased to the second signal by the voltage rail 285 (e.g., ground). That is, referring to the table of FIG. 3, six of the seven select lines S1-S7 that control the switches 270*a-g*, respectively, will be held inactive (at 0) with a single select line held active (at 1). When this single input diffusion region 203*c* is selectively biased, impedance will be biased to the second signal (e.g., will go low) in that region 203*c*. However, impedance will remain the same (e.g., high) in all of the other input diffusion regions (e.g., in 203*a-b* and 203*d-g*) because, although these other input diffusion regions are coupled to the output diffusion region 202, they are not connected to a voltage rail (i.e., they are not connected to ground 285). Thus, they effectively float and follow the bias of the variable-delay FET 201 as the gate structure 210 is activated.

When the signal wave (i.e., the first signal from device 281 that requires phase adjustment) is injected into the input node 280, it will pass into the gate structure 210 at one end (i.e., at gate extension 216*a*). As an active edge of the first signal reaches the gate segment (e.g., 215*c*) that is positioned adjacent to the biased input diffusion region 203*c* and its selected isolation tabs (e.g., the adjacent extensions 216*c-d* isolating the selected input diffusion region 203*c*), a channel (i.e., an electrical connection) will be enabled between the selected/biased input diffusion region 203*c* and the output diffusion region 202. Selectively biasing the input diffusion region 203*c* allows a second signal (i.e., a phase adjusted signal) to begin passing from the selected/biased input diffusion region 203*c* to the output diffusion region 202 once the channel is enabled. That is, if the selection FET 270*c* and variable-delay FET 201 are n-type and the current source 260 is p-type, propagation of a high voltage through the multi-gate segment structure 210 will pull down the output diffusion region 202, when the selected input diffusion region 203*c* is reached by the first signal. Then, at the output node 250, the second signal (i.e., the phase adjusted signal) is combined with the load from current source 260. Finally, when the inactive edge of the first signal passes through gate segment 215*c* corresponding to the selected input diffusion region 203*c*, conduction between the selected input diffusion region 203*c* and the output diffusion region 202 will be cut off (i.e., transmission of the second signal is broken) and the output diffusion region 202 will be pulled by current source 260.

The phase difference between the first signal input into the gate structure 210 and the second signal at the output diffusion region 202 is based at least in part on which input diffusion region (e.g., 203*c*) is selectively biased relative to the originating point of the first signal. That is, the greater the distance between the selected input diffusion region and the originating point of the first signal in the gate structure 210 (i.e., gate extension 216*a*), the greater the propagation delay and, thus, the greater the phase adjustment. The closer the distance between the selected input diffusion region and the originating point of the input signal in the gate structure, the smaller the propagation delay and, thus, the smaller the phase adjustment.

Figure 4:
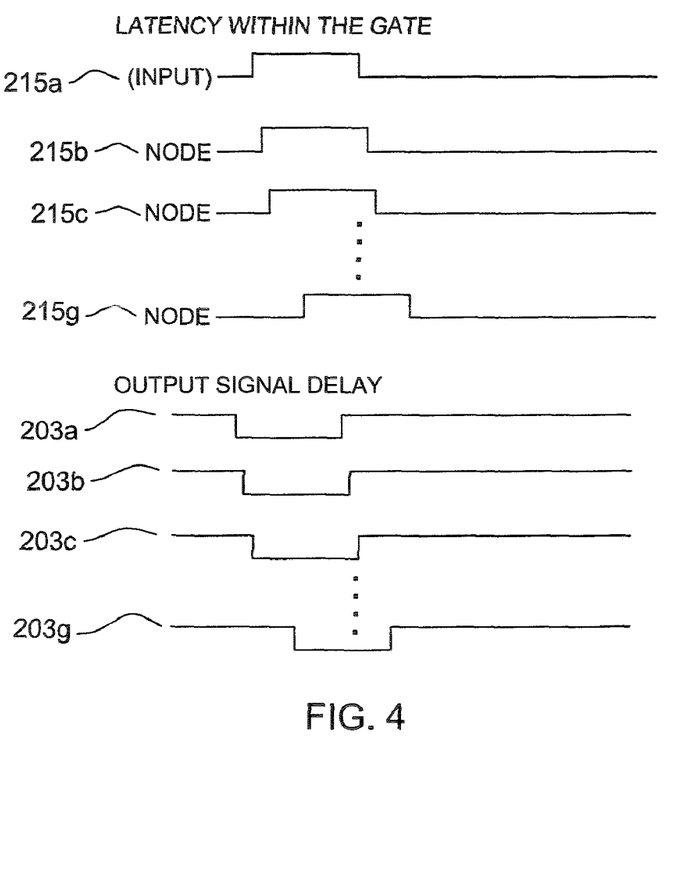
FIG. 4 is a diagram illustrating exemplary gate structure latency and output signal delay.

FIG. 4 illustrates the latency generated within the gate structure 210 from signal input at one end of the gate (i.e., at gate extension 216*a*) to the other end of the structure (i.e., at gate extension 216*h*). FIG. 4 further illustrates the delay in the output signal measured at the output node 250 connected to the output diffusion region 202 in response to selection of input diffusion region 203*a*, 203*b*, 203*c*, ... 203*g*. Thus, when switch 270*a* controlled by select line S1 is turned on, minimal phase adjustment is provided because the time delay between application of the input signal active edge to the gate 210 and the activation of gate segment 215*a* is minimal. When switch 270*b* controlled by select line S2 is turned on and a first signal is driven into the gate structure 210, as the active edge of the first signal reaches the far end of the first gate segment 215*a*, the isolation FET (i.e., gate extension 216*b*) between input diffusion regions 203*a* and 203*b* begins to turn on. Subsequently, the second gate segment 215*b* turns on and connects to the output diffusion region 202. Likewise, turning on of switches 270*c-g* via lines S3 through S7 provide increasing latency between the active edge as it is when the first signal enters the gate structure 210 at extension 216*a* and the inverting output at the output diffusion region 202. On the inactive edge, the gate segments 215*a-g* as well as the isolation gates (i.e., gate extensions 216*b-g*) between each of the input diffusion regions 203*a-g* turn off in the same order.

Alternatively, during operation of the phase-adjusting circuit 201 of FIG. 2, multiple input diffusion regions (e.g., input diffusion regions 203*b* and 203*d*) can be selectively and simultaneously biased (i.e., simultaneously switched on by corresponding switches 270*b* and 270*d*). When these multiple input diffusion regions 203*b* and 203*d* are selectively biased, impedance will go to the second signal (e.g., low) in the selected input diffusion regions 203*b* and 203*d*, but will remain the same (e.g., high) in all of the other input diffusion regions (e.g., 203*a*, 203*c*, 203*e-g*). When the first signal is driven into the input node 280 and received by the gate structure 210 at one end (e.g., at gate extension 216*a*), channels will be enabled between the input diffusion regions 203*a-g* and the output diffusion region 202 in sequence. However, as the active edge of the first signal reaches the gate segment 215*b* that is positioned adjacent to the first biased input diffusion region 203*b*, a second signal (i.e., a phase adjusted signal) will begin passing from the first selectively biased input diffusion region 203*b* to the output diffusion region 202. When the active edge of the first signal passes through the gate segment 215*d* adjacent to the second selected input diffusion region 203*d*, nothing happens because the output diffusion region 202 is already biased to the second signal (e.g., pulled-down). Similarly, when the inactive edge of the first signal passes through the gate segment 215*b* adjacent to the first selected input diffusion region 203*b*, nothing happens because the output diffusion region 202 continues to be biased to the second signal (e.g., pulled-down) due the biasing of the second selected input diffusion region 203*d*. Only when the inactive edge of the first signal passes through the gate segment 215*d* (i.e., the gate segment that corresponds to the last selected input diffusion region 203*d*) is the electrical connection broken (i.e., is transmission of the second signal broken), thereby, allowing the output diffusion region 202 to again be pulled by the current source 260. Thus, not only is the phase of the first signal adjusted, but also the pulse width.

As mentioned above, propagation delay is based, not only on input diffusion region selection, but also on gate resistance and capacitance (i.e., gate RC delay). Thus, gate resistance and capacitance can be finely tuned during design in order to achieve the desired phase offset increments. For example, the top surface of the gate structure 210 can be completely salicided to minimize and make uniform resistance and, thereby, propagation delay in the gate structure 210. Alternatively, as illustrated in FIG. 1 and discussed above, silicide regions can be formed on only selected portions of the top surface of the gate structure such that resistance across the gate structure 110 and, thereby, propagation delay is tailored. For example, the top surface of the gate structure 110 at the gate segment 115a-g interfaces may be devoid of silicide (see non-silicide regions 125 in FET 101 of FIG. 1) so as to delay signal propagation between each of the adjacent gate segments (e.g., between gate segments 115a and 115b, 115b and 115c, etc.).

Figure 5:
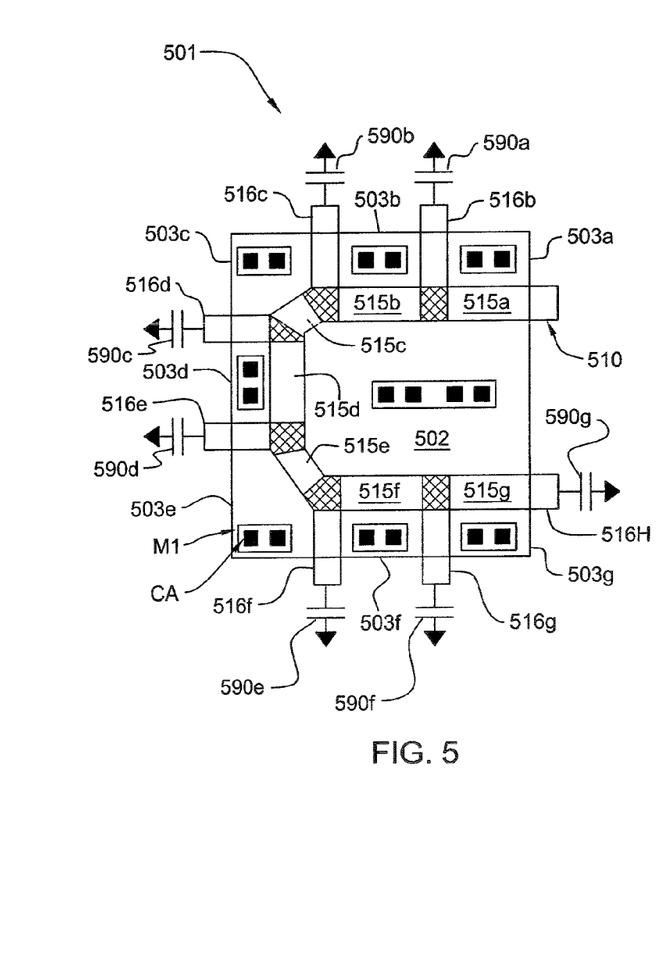
FIG. 5 is a schematic diagram illustrating an exemplary variable-delay field effect transistor of FIG. 1 with added capacitance.

Additionally, as illustrated in FIG. 5, to further increase propagation delay, in a variable-delay field effect transistor 501 one or more capacitors 590a-g can be electrically connected to the gate structure 510 of FET 501 at one or more of the gate extensions 516b-h. Specifically, it may be advantageous to add capacitance to the gate structure 510 at select intervals to further increase the phase adjust capability available between each of the input diffusion regions 503a-g. Charging each of the gate segments 515a-g, when gate extension capacitors 590a-g are added to the embodiment, incurs a larger resistance-capacitance (RC) delay.

Figure 6:
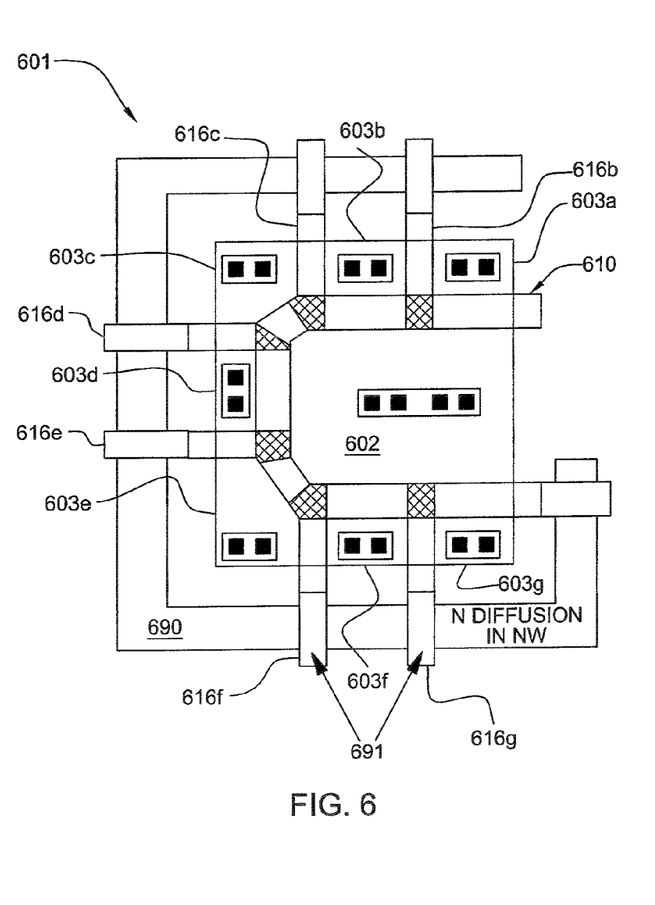
FIG. 6 is a diagram illustrating an exemplary physical structure of the variable-delay field effect transistor of FIG. 1 with added capacitance.

FIG. 6 illustrates an exemplary capacitor back plate structure 690 that may be built outside the FET 601 structure and may be used to capacitively couple each of the gate extensions 616b-g which separate-adjacent input diffusion regions 603a-g to a reference voltage. The capacitor back plate structure 690 can be used to form for example at least one n-FET in n-well capacitor 691 built in order to provide additional capacitance at each of the gate extensions 616b-g. Thus, the polysilicon of the multi-gate structure 610 can also be used as the gate of the n-FET in n-well capacitor 691 with capacitor back plate 690 forming the second terminal of the capacitor.

Figure 7:
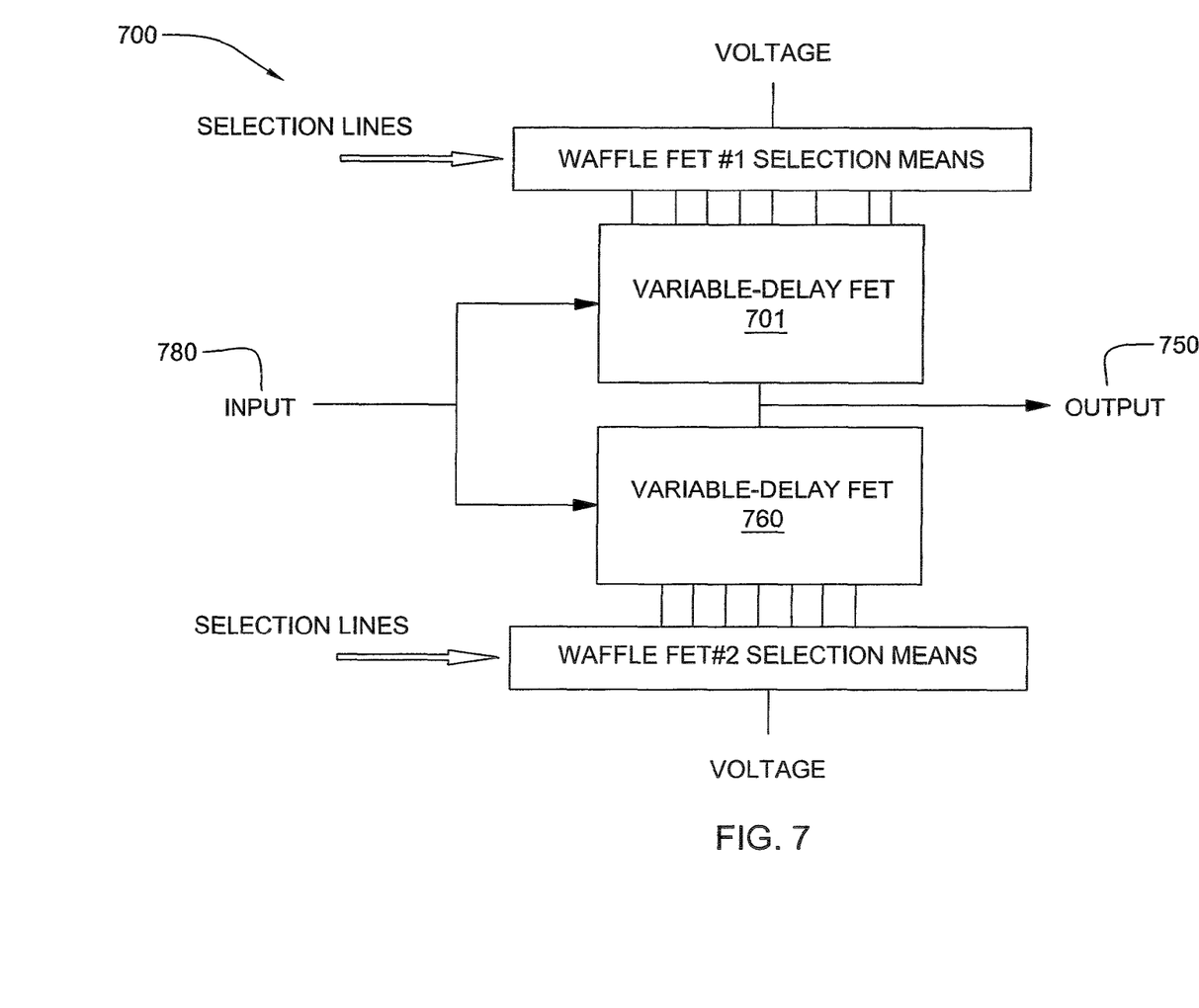
FIG. 7 is a schematic diagram illustrating an exemplary phase adjusting circuit incorporating multiple variable-delay field effect transistors.

Referring again to FIG. 2, in one embodiment the phase adjusting circuit embodiment 200 can comprise a current source 260 that is constant. For example, this current source 260 can comprise a constant current source, such as, a biased FET, a diode-connected FET, or any other suitable device that is sized to provide appropriate signal swing). Alternatively, referring to FIG. 7, another embodiment of a phase adjusting circuit 700 can comprise a current source 760 that is not constant, but rather that is controlled by the first signal at the input node 780. More particularly, the phase adjusting circuit 700 can comprise a variable-delay FET 701, as described above, and can further incorporate an additional delay device as the current source 760. The additional delay device can, for example, comprise a second variable-delay FET (as illustrated in FIG. 7) configured in the same manner as the first variable delay FET 701, a non-variable delay FET or any other suitable delay device.

In phase adjusting circuit 700 both the variable-delay FET 701 and the additional delay device (i.e., current source 760) can be connected between the input node 780 and the output node 750 and can be adapted to receive the same first signal from the input node 780. Furthermore, both the variable-delay FET 701 and the additional delay device (i.e., current source 760) can be adapted to simultaneously, but independently, phase adjust that first signal. As mentioned above, each of the delay devices 701 and 760 can be connected to a single output node 750 (i.e., the output node of the phase adjusting circuit 700). This single output node 750 can be adapted to combine the separate and simultaneously phase adjusted signals from the different delay devices 701, 760 such that the final output of the phase adjusting circuit 700 is a single combined phase adjusted signal. Thus, by independently selecting the phase delay of both a variable-delay FET 701 and a second variable-delay FET 760 in the same circuit 700, the phase delay imparted to a rising edge of the output waveform may be controlled independently with respect to the phase delay imparted to a falling edge of the output waveform.

Figure 8:
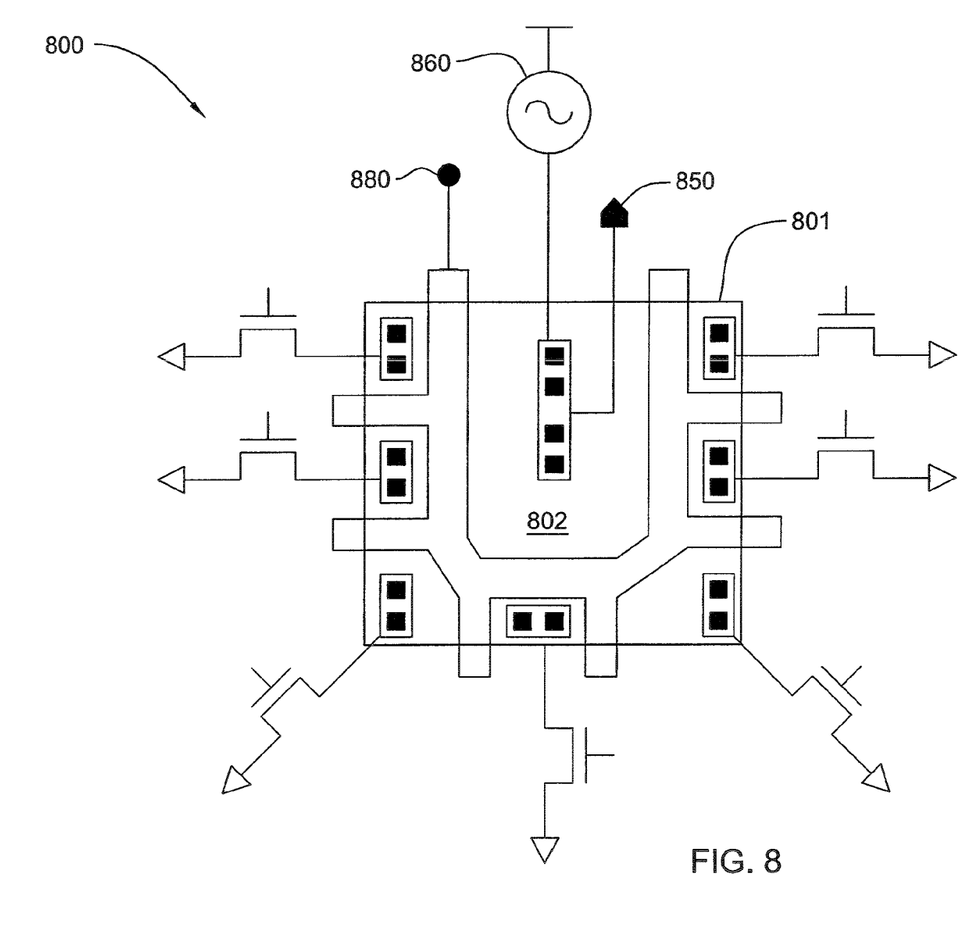
FIG. 8 is a schematic diagram illustrating an exemplary phase adjusting mixer circuit.

In yet another embodiment, referring to FIG. 8, the phase adjusting circuit 800 can also comprise a non-constant current source 860. However, the non-constant current source 860 can further be independent of the first signal (i.e., independent of the signal requiring phase adjustment) at the input node 880. Thus, the circuit 800 functions as both a phase adjusting circuit and a mixer circuit. Specifically, an embodiment of a phase adjusting mixer circuit 800 can comprise many of the various features set out above with regard to the phase adjusting circuit 200 of FIG. 2. However, the current source or load device 860 (the biasing mechanism) of the circuit 800 is not connected to the input node 880 and can be a time-varying current source adapted to transmit a third signal (i.e., a different input signal) to the output node 850. Thus, the output node 850 receives, not only a second signal (i.e., a phase adjusted signal) from the output diffusion region 802 of the variable-delay FET 801, but also a third signal from the current source 860. The signals are combined at the output node 850 such that the output of the phase adjusting mixer circuit 800 comprises a fourth signal that is a mix of both the second signal from the variable-delay FET 801 and the third signal from the current source 860. As with the phase adjusting circuit 200, selective biasing of one or more of the input diffusion regions of the variable delay FET 801 controls the mixer circuit delay.

Figure 9:
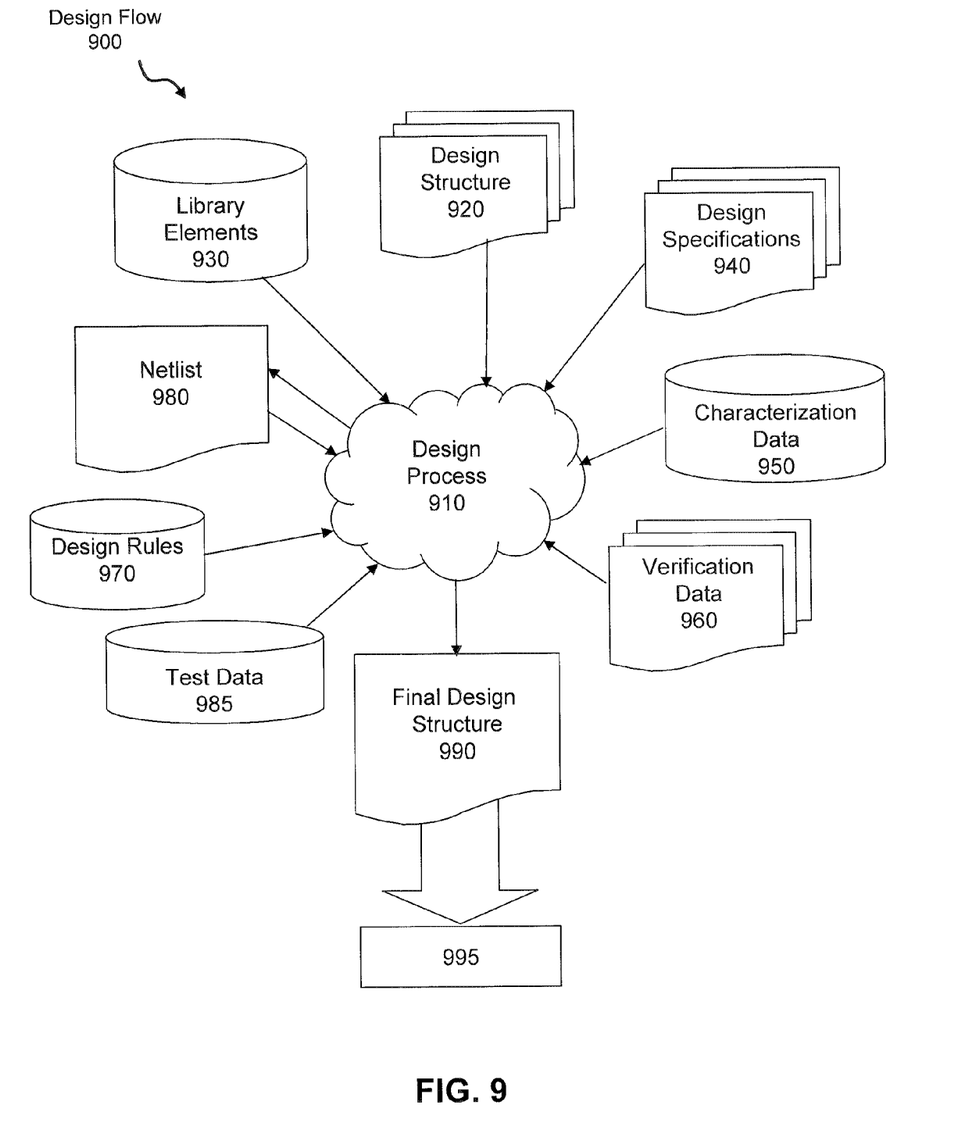
FIG. 9 is a flow diagram of a design process used in semiconductor design, manufacturing, and/or test.

FIG. 9 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises the circuits 101, 200, 501, 601, and 800 in the form of schematics or HDL, a hardware-description language (e.g., Verilog, VHDL, C, etc.). Design structure 920 may be contained on one or more machine readable medium. For example, design structure 920 may be a text file or a graphical representation of the circuits 101, 200, 501, 601, and 800. Design process 910 preferably synthesizes (or translates) the circuits 101, 200, 501, 601, and 800 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 9, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 9. Design structure 990 may then proceed to a stage 995 where, for example, design structure 990: proceeds to tape-out, is released to manufacturing, is released to a mask house, is sent to another design house, is sent back to the customer, etc.

Therefore, disclosed above are embodiments of a variable-delay field effect transistor (FET) having multiple source regions that can be individually and selectively biased to provide an electrical connection to a single drain region. Delay is a function of which of the multiple source regions is/are selectively biased as well as a function of gate resistance and capacitance. Such a variable-delay FET can be incorporated into a phase adjusting circuit, which uses gate propagation delays to selectively phase adjust an input signal. Operation of the phase adjusting circuit with a single biased source region phase adjusts the input signal while operation of the circuit with multiple biased source regions provides both phase adjustment and pulse width expansion. Operation of the phase adjusting circuit in a mode with multiple biased source regions can therefore be used to correct for pulse width shrinkage effects in digital logic paths. The phase adjusting circuit can be tuned by incorporating non-silicided resistances and additional capacitance at various positions on the gate structure. The phase adjusting circuit can further be modified into a phase adjusting mixer circuit that enables a phase adjusted signal to be combined with an additional signal.

The foregoing description of the specific embodiments will so fully reveal the general nature of the invention that others can, by applying current knowledge, readily modify and/or adapt for various applications such specific embodiments without departing from the generic concept and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A design structure for a field effect transistor, said design structure being embodied in a computer readable medium accessible by a computer that executes said design structure in a design process to produce said field effect transistor, said field effect transistor comprising:
    a channel region having a first side and a second side opposite said first side;
    an output diffusion region adjacent to said first side of said channel region;
    a plurality of input diffusion regions adjacent to said second side of said channel region opposite said output diffusion region, each one of said input diffusion regions being positioned laterally adjacent to at least another one of said input diffusion regions and further being selectively biasable so as to allow delay of said field effect transistor to be selectively varied; and
    a gate structure comprising:
        a main body on said channel region between said input diffusion regions and said output diffusion region; and
        a plurality of extensions that project outward from said main body at each interface between adjacent input diffusion regions, said extensions providing off-mode separation between said adjacent input diffusion regions.

2. The design structure according to claim 1, said main body having any one of the following:
    a U-shape with said output diffusion region inside said U-shape and said input diffusion regions wrapping around outside said U-shape; and,
    a linear shape with said output diffusion region on one side of said linear shape and said input diffusion regions on an opposite side of said linear shape.

3. The design structure according to claim 1, wherein said design structure comprises a netlist which describes a circuit.

4. The design structure according to claim 1, wherein said design structure resides on a storage medium as a data format used for the exchange of layout data of integrated circuits.

5. The design structure according to claim 1, wherein said design structure includes at least one of test data files, characterization data, verification data, and design specifications.

6. A design structure for a phase adjusting circuit, said design structure being embodied in a computer readable medium accessible by a computer that executes said design structure in a design process to produce said phase adjusting circuit, said phase adjusting circuit comprising:
    an input node for receiving a first signal;
    a variable-delay field effect transistor comprising:
        an output diffusion region;
        a plurality of input diffusion regions; and
        a gate structure connected to said input node and comprising:
            a main body between said input diffusion regions and said output diffusion region; and
            a plurality of extensions that project outward from said main body between adjacent input diffusion regions,
        wherein said input diffusion regions are adapted to be selectively biased in order to selectively vary delay of said variable-delay field effect transistor,
        wherein said output diffusion region is adapted to receive, from a biased input diffusion region, a second signal, and
        wherein a phase difference between said first signal and said second signal is based on said delay;
    an output node connected to said output diffusion region; and
    a current source connected to said output node and adapted to bias said output node when said variable-delay field effect transistor is off.

7. The design structure according to claim 6, wherein said gate structure is further adapted to propagate said first signal through segments of said main body sequentially.

8. The design structure according to claim 7, wherein, if a single input diffusion region is selectively biased, said first signal is propagated through said segments of said main body such that, when an active edge of said first signal passes through a gate segment corresponding to said single input diffusion region, a channel is enabled and said second signal is transmitted to said output diffusion region, and such that, when an inactive edge of said first signal passes through said gate segment, transmission of said second signal is broken.

9. The design structure according to claim 7, wherein, if a plurality of input diffusion regions are selectively biased, said first signal is propagated through said segments of said main body such that, when an active edge of said first signal passes through a first gate segment corresponding to a first biased input diffusion region, a channel is enabled and said second signal is transmitted to said output diffusion region, and such that, when an inactive edge of said first signal passes through a last gate segment corresponding to a last biased input diffusion region, transmission of said second signal is broken.

10. The design structure according to claim 6, further comprising switches connected between said input diffusion regions and a voltage rail so as to allow selective biasing of said input diffusion regions.

11. The design structure according to claim 6, further comprising silicide regions on only selected portions of a top surface of said gate structure such that resistance across said gate structure and, thereby, said delay is tailored.

12. The design structure according to claim 6, further comprising at least one capacitor electrically connected to at least one of said extensions.

13. The design structure according to claim 6, wherein said main body is one of:
    non-linear and positioned so as to at least partially wrap around said output diffusion region; and
    linear and positioned adjacent only one side of said output diffusion region.

14. The design structure according to claim 6, wherein said design structure comprises a netlist which describes a circuit.

15. The design structure according to claim 6, wherein said design structure resides on a storage medium as a data format used for the exchange of layout data of integrated circuits.

16. The design structure according to claim 6, wherein said design structure includes at least one of test data files, characterization data, verification data, and design specifications.

17. A design structure for a phase adjusting mixer circuit, said design structure being embodied in a computer readable medium accessible by a computer that executes said design structure in a design process to produce said phase adjusting mixer circuit, said phase adjusting mixer circuit comprising:
    an input node for receiving a first signal;
    a variable-delay field effect transistor comprising:
        an output diffusion region; and
        a plurality of input diffusion regions; and
        a gate structure connected to said input node and comprising:
            a main body between said input diffusion regions and said output diffusion region; and
            a plurality of extensions that project outward from said main body between adjacent input diffusion regions,
    wherein said input diffusion regions are adapted to be selectively biased in order to selectively vary delay of said variable-delay field effect transistor,
    wherein said output diffusion region is adapted to receive, from a biased input diffusion region, a second signal, and
    wherein a phase difference between said first signal and said second signal is based on said delay;
    an output node electrically connected to said output diffusion region; and
    a current source connected to said output node and adapted to transmit a third signal to said output node,
    wherein said current source is non-constant, and
    wherein said output node is adapted to combine said second signal and said third signal.

18. The design structure according to claim 17, wherein said design structure comprises a netlist which describes a circuit.

19. The design structure according to claim 17, wherein said design structure resides on a storage medium as a data format used for the exchange of layout data of integrated circuits.

20. The design structure according to claim 17, wherein said design structure includes at least one of test data files, characterization data, verification data, and design specifications.

* * * * *